United States Patent [19]  [11] 4,014,779
Kuehnle  [45] Mar. 29, 1977

[54] SPUTTERING APPARATUS

[75] Inventor: Manfred R. Kuehnle, Lexington, Mass.

[73] Assignee: Coulter Information Systems, Inc., Bedford, Mass.

[22] Filed: Dec. 17, 1975

[21] Appl. No.: 641,481

Related U.S. Application Data

[60] Continuation-in-part of Ser. No. 519,781, Nov. 1, 1974, and a continuation-in-part of Ser. No. 612,859, Sept. 12, 1975, said Ser. No. 519,781, is a division of Ser. No. 322,133, Jan. 12, 1973, Pat. No. 3,884,787, said Ser. No. 612,859, is a division of Ser. No. 436,444, Jan. 25, 1974, Pat. No. 3,905,887, which is a division of Ser. No. 322,968, Jan. 12, 1973, Pat. No. 3,829,373.

[52] U.S. Cl. .................... 204/298; 204/192 R
[51] Int. Cl.² ........................... C23C 15/00
[58] Field of Search ........... 204/192, 298; 118/49.1

[56] References Cited

UNITED STATES PATENTS 3,272,175  9/1966  Lorenz et al. ............... 118/49
3,818,982  6/1974  Wagner ....................... 165/86

FOREIGN PATENTS OR APPLICATIONS 367,074  2/1932  United Kingdom .......... 204/298

Primary Examiner—John H. Mack
Assistant Examiner—Aaron Weisstuch
Attorney, Agent, or Firm—Silverman & Cass, Ltd.

[57] ABSTRACT

A sputtering machine which has a rotary anode that is insulated from its supporting structure and maintained at a voltage differing from that of the supporting structure. Means are provided for controlling the temperature of the surface of the anode through circulating heat exchange liquid.

19 Claims, 9 Drawing Figures

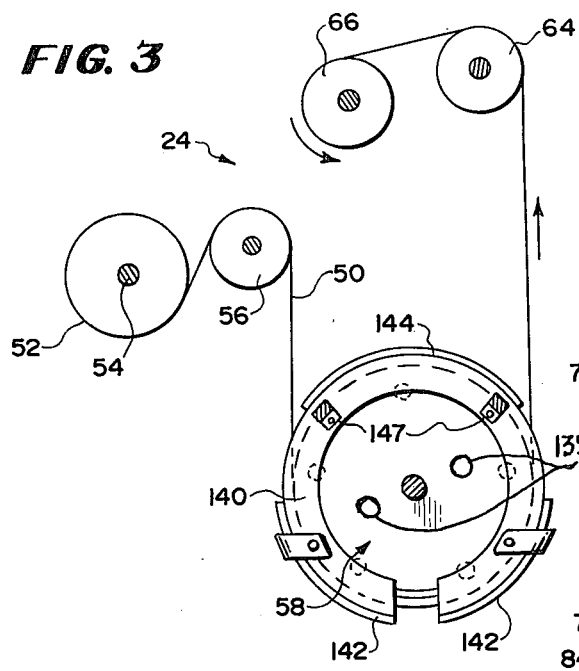
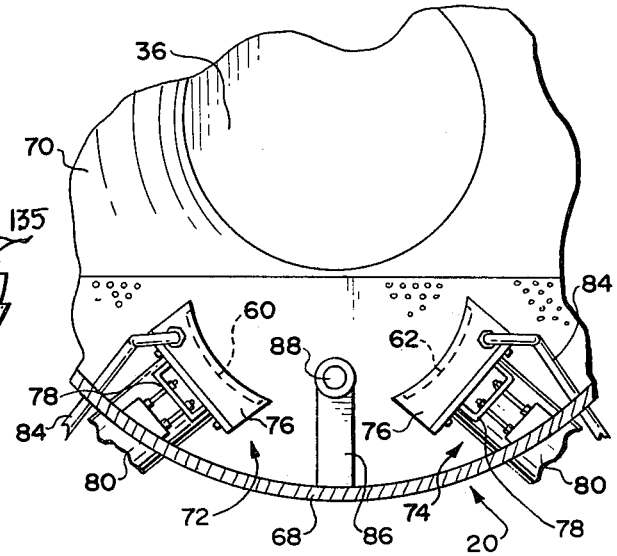
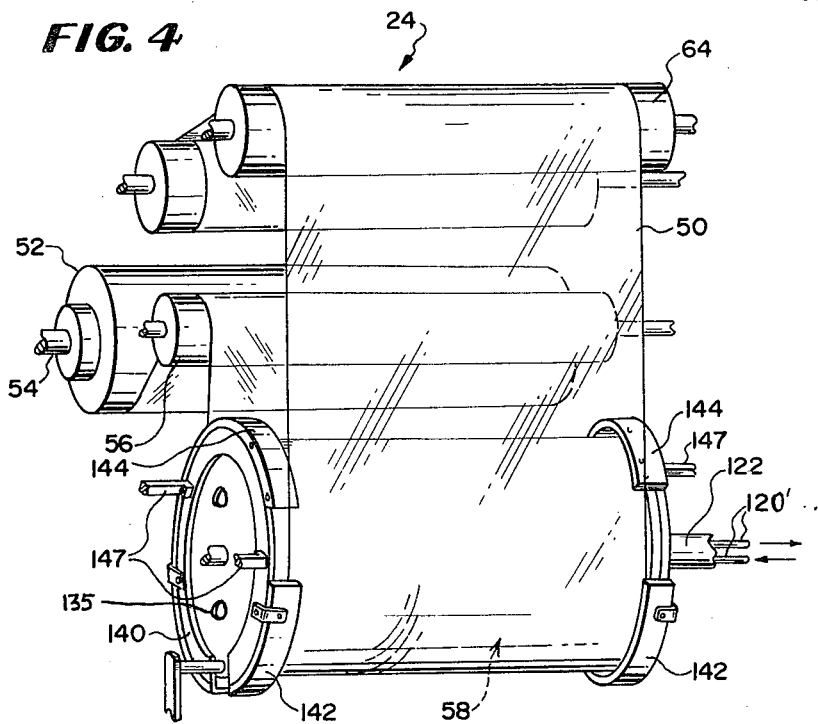

SPUTTERING APPARATUS

CROSS-REFERENCE TO RELATED APPLICATIONS

This application is a continuation-in-part of now pending applications Ser. Nos. 519,781 filed Nov. 1, 1974 and 612,859 filed Sept. 12, 1975.

Application Ser. No. 519,781 is entitled "METHOD AND APPARATUS FOR THIN FILM DEPOSITION ON A SUBSTRATE", and is a divisional application of my earlier application, Ser. No. 323,133 filed Jan. 12, 1973, entitled "METHOD AND APPARATUS FOR THIN FILM DEPOSITION ON A SUBSTRATE", now U.S. Pat. No. 3,884,787 granted May 20, 1975, entitled "SPUTTERING METHOD FOR THIN FILM DEPOSITION ON A SUBSTRATE".

Application Ser. No. 612,859 is entitled "THIN FILM DEPOSITION APPARATUS USING SEGMENTED TARGET MEANS" and is a divisional application of my earlier application Ser. No. 436,444 filed Jan. 25, 1974, which in turn was a divisional application of earlier application Ser. No. 322,968 filed Jan. 12, 1973. Ser. No. 436,444 has now been issued as U.S. Pat. No. 3,905,887 on Sept. 16, 1975 and Ser. No. 322,968 has now been issued as U.S. Pat. No. 3,829,373 on Aug. 13, 1974; Ser. No. 436,444, now U.S. Pat. No. 3,905,887 being entitled "THIN FILM DEPOSITION METHOD USING SEGMENTED PLASMA" and Ser. No. 322,968, now U.S. Pat. No. 3,829,373 being entitled "THIN FILM DEPOSITION APPARATUS USING SEGMENTED TARGET MEANS".

All applications and patents identified above are owned by the assignee of this application.

FIELD AND BACKGROUND OF THE INVENTION

The field of the invention is sputtering and the apparatus which is used in sputtering techniques. Specifically the invention is concerned with sputtering machines in which the anode is rotary and a flexible substrate is led over the anode and required to receive materials that are deposited thereon.

Generally the apparatus which comprises the environment of the invention and the method of sputtering are both disclosed in U.S. Pat. No. 3,884,787. The structure which is disclosed in said patent and which is common to the structure of the invention herein includes a pressure vessel having at least one target or cathode mounted therein, a rotary anode mounted for rotation within the vessel, means for mounting a supply of flexible substrate such as polyester film in the vessel, means for mounting a take-up mechanism in the vessel, and suitable controls for operating the apparatus. The substrate is arranged to be led over the anode and a sputtering plasma established in the vessel. The material from which the target is made is sputtered onto the anode, but since the substrate is carried on the surface of the anode, the material is coated onto the substrate.

It is understood that auxiliary apparatus, supply means and controls are provided for furnishing the ionizing gas and its mixed components and for monitoring and controlling the feed to the chamber; for furnishing electrical energy to the apparatus and monitoring and controlling the same and its effects; for controlling and monitoring speed, temperature, thickness of deposit, and many other parameters; for driving the substrate in its path and monitoring and controlling its tension; etc.

In a technique which has been studied and developed, it has been found that for the deposit of certain materials, particularly photoconductors upon thin, flexible, transparent substrates, the conditions of deposition include, among others, the following:

a. The anode is required to rotate, b. The power which is supplied is coupled to the cathode, anode and shielding in the vessel in an electrical circuit or network in which the cathode is at maximum negative voltage, the shielding is at ground potential and the anode is at a potential that is also negative with respect to ground, but to a much lesser degree than the cathode, c. The anode surface is required to be temperature controlled to prevent excessive loss of heat during sputtering, Certain other requirements of the apparatus render the achievement of the above conditions very difficult to effect and these include:

d. Maintaining all of the supporting structure of the apparatus including the chamber walls, at ground potential for practicality and safety, e. Maintaining the ends of the drum shielded to prevent excessive deposit thereon, f. Moving the substrate-carrying portion or transport of the apparatus into and out of the chamber when the sputtering is completed.

The last-mentioned requirement is for the most part understood to be necessary from the above-mentioned patent in the case of a sputtering apparatus which is to produce quantities of sputtered substrate and which of necessity is large and cumbersome. The solution to the problem proposed by the patent is to mount the substrate-carrying portion of the apparatus on a carriage along with much of the control and measuring equipment and to fix the chamber and all of its auxiliary apparatus to a support which is stationary. In such case the targets are secured within the chamber and the high voltage connections are associated with the chamber, along with the controls and instrumentation therefor; however, this arrangement does not take into consideration that the anode must be maintained at a voltage different from ground.

The invention herein provides a solution to all of the problems which are raised by the above conditions in an unobvious manner by means which are elegant and yet simple and economical.

SUMMARY OF THE INVENTION

According to the invention, a sputtering apparatus has a vessel or chamber with its auxiliary equipment including means to establish the sputtering plasma condition therein and the target means mounted therein, substrate-carrying or transport means including supply and take-up means for flexible substrate and a rotary anode over which the substrate is led during the sputtering process. The vessel or chamber and the substrate carrying means are arranged to move relative to one another. In the case of large structures the chamber is fixed and the rotary anode is mounted for horizontal translation on a carriage that moves on rails.

The rotary anode is in the form of a drum whose outer skin and ends are of metal but insulated from one another by an intervening spacer or cylinder of electrically insulating material. An axial end of the skin is exposed at least to one end of the drum. The shaft which mounts the drum is provided with passageways which lead heat-exchange liquid to the drum and suitable connections are provided to a chamber coaxial with the outer skin and, along therewith, insulated from the remainder of the drum by that same spacer. The heat-exchange liquid is an insulating material and the drum includes in its conduits sections which are electrically insulating so as not to short circuit the drum skin.

A substantial portion of each of the drum ends is shielded by metallic shielding means that are maintained at ground potential. There is an opening in the drum shielding at the forward end of the drum, that is, the end which first enters the vessel or chamber when the parts are moved together. In the vessel or chamber, between the targets, there is a fixed mounting, having a spring-pressed electrical wiper positioned to come into resilient engagement with the axial end of the drum on a ring connected with the skin thereof when the parts of the apparatus are seated and sealed together. This wiper is insulated from the vessel and chamber walls and connected into the high voltage circuit to provide the necessary voltage from the high voltage supply voltage divider to bias the anode during the sputtering operation.

Another embodiment of the invention which is intended for application to relatively smaller equipment has the drum mounted for vertical movement into and out of the vertically arranged vessel or chamber, there being an insulating coupling between the drum and its rotary mounting so that the entire drum can be maintained at a voltage different from that of ground. The voltage contact with the drum can be made by an extension of a central conduit that is used to carry the heat-exchange fluid to the interior of the drum and an external wiper connected to the high voltage circuit.

BRIEF DESCRIPTION OF THE DRAWINGS

FIG. 3 is a diagrammatic view taken generally from the plane 3—3 of FIG. 2 and looking in the direction indicated to illustrate the path of movement of the substrate on the transport means;

FIG. 4 is a more or less diagrammatic perspective view of the transport means;

FIG. 5 is a fragmentary sectional view taken generally through the chamber of the apparatus along the line 5—5 of FIG. 2 and in the indicated direction;

DESCRIPTION OF THE PREFERRED EMBODIMENTS

Figure 1:
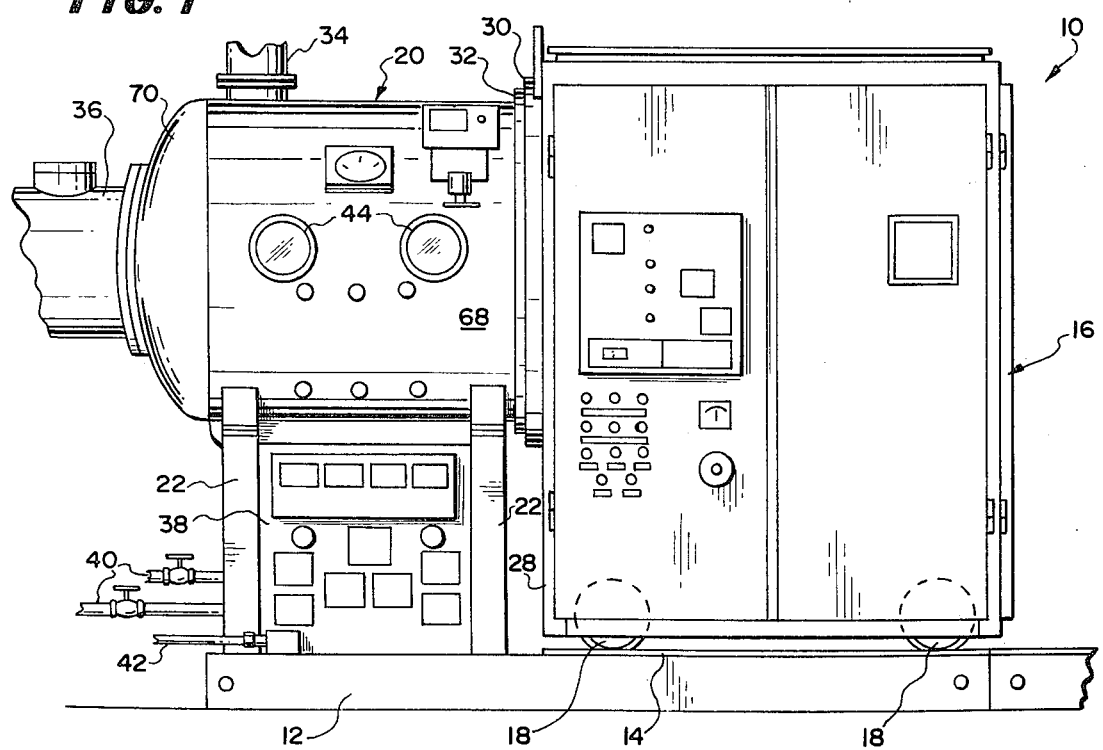
FIG. 1 is a side elevational view of the sputtering apparatus of the invention in a closed condition, certain of the connections to exterior apparatus being illustrated fragmentarily, indicating that such exterior apparatus is associated with the sputtering apparatus.

The invention is embodied in this description in two forms, one of which is suitable for commercially sputtering coatings on relatively wide strips of polyester film and the other of which is suitable for low production or experimental work and sputters coatings on narrow strips. The sizes of the two sputtering apparatuses are considerably different and the lengths of material capable of being coated without opening the apparatus also differ. In the one instance the strip is of the order of about 50 centimeters wide and in the other it is of the order of 10 centimeters wide.

The apparatus which is detailed initially is the larger of the two and the more complex, but operating and constructed in accordance with principles which are common with those governing the construction and operation of the smaller apparatus.

The sputtering apparatus which is illustrated in FIGS. 1 through 8 is designated generally by the reference character 10 and comprises a stationary base or supporting framework 12 which includes tracks 14 along an upper edge thereof; a component cabinet 16 mounted on rollers or wheels 18 engaged on the tracks 14; a pressure vessel or chamber 20 supported from the framework 12 by fixed standards 22; and various other parts and structure to be described. The cabinet 16 has transport means 24 mounted to its left hand end supported on a suitable cantilever subframe 26 which is secured to the forwardly facing wall 28 of the cabinet 16.

Figure 2:
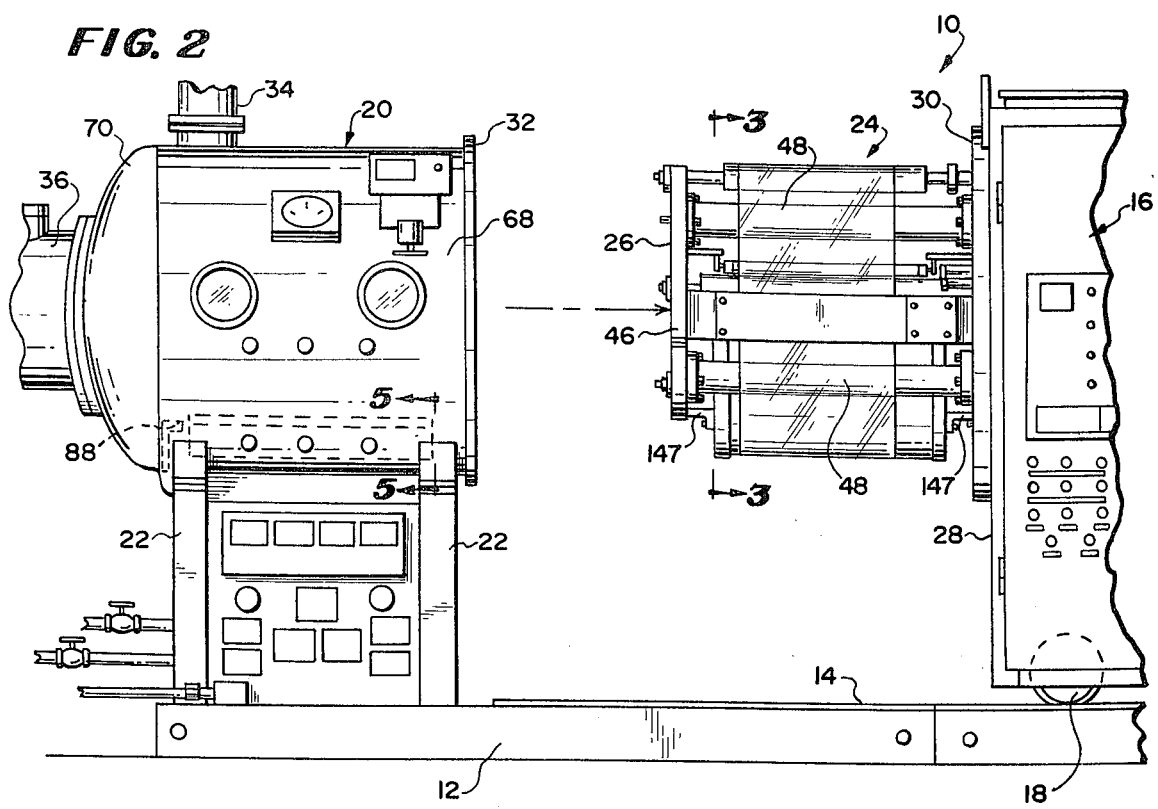
FIG. 2 is a view similar to that of FIG. 1 but in which the sputtering apparatus is in an open condition.

The wall 28 mounts a circular sealing seat 30 and the transport means 24 and the transport means subframe 26 are dimensioned and arranged to be encompassed within the cylinder defined by a projecton of the sealing seat 30. The pressure chamber on vessel 20 is closed on all sides but its right hand end where a flange 32 is provided adapted to be sealingly engaged against the seat 30. In FIG. 1 the apparatus is shown in its closed condition, the cabinet 16 having been rolled forward (to the left) and thereby having inserted the transport means 24 into the chamber or vessel 20, the joint represented by the flange 32 and the sealing seat 30 being rendered hermetic by suitable gasket and locking means (not shown). In FIG. 2 the apparatus is shown in its open condition, the cabinet 16 and the chamber or vessel 20 being separated, giving access to the transport means 24 and any substrate which is carried thereon and to the interior of the chamber 20.

The transport means 24 which are illustrated do not show driving and controlling means which are contained in the cabinet 16, these means for a great part being mounted on the rear of the wall 28. The exact nature thereof is subject to wide variation and such details are not germane to the invention although, of course, such means are presumed to be required for the operation of the apparatus. The cabinet also contains considerable apparatus and structure needed for the total operation of the apparatus, including speed controls, driving means, pumps and conduits for handling heat exchange liquid, a large number of measuring instruments for temperatures, pressures, currents, voltages, etc. The outer wall of the cabinet 16 is illustrated as having many push-buttons, meters, lights, and the like but only by way of representation.

The chamber or vessel 20 is shown having gas connections at 34 and 36, an electrical panel at 38, pipes and conduits at 40, electrical lines at 42, push-buttons, meters, etc. Viewing windows are shown at 44. All of these are also representative. The apparatus 10 requires considerable control and monitoring as is well-known to those skilled in this art and the nature of measurement, operation and control apparatus will vary with the requirements of the apparatus.

Basically, there are needs to operate a sputtering machine which must be furnished, controlled, measured and often recorded. There are phenomena which must be measured and observed. The parameters are manifold. High frequency energy must be furnished to the targets, requiring matching and control circuits, conduits, and often cooling means. In the latter respect, since the targets are in the chamber or vessel 20, the coolant for the targets must be provided in the chamber, and means must be available to carry the coolant, circulate it, etc. The chamber has to be pumped down, requiring vacuum pumps with accompanying regulation, controls and measurement; gases for ionization and background have to be introduced requiring regulation, control, measurement and proportioning.

It is assumed that the necessary means for accomplishing the functions for a sputtering machine as described will be provided, hence there is no need to illustrate them in more detail and describe them further.

The basic invention is primarily concerned with the construction of the apparatus which is devised for the purpose of enabling the use of a rotary drum as an anode, providing for its ready movement into and out of the chamber and its association with transport means so that the substrate may be mounted on and removed from the transport means quickly and easily and providing for a type of electrical circuit which enables the rotating anode to be biased relative to ground instead of being at ground potential. For efficiency and safety, the structure of the invention utilizes a chamber which is made out of stainless steel so as to be able to contain the negative pressures met in the sputtering process, this chamber and all exposed metal work being grounded.

The cantilever subframe 26 is illustrated only in FIG. 2 but should be understood to provide the support for the transport means 24 although not illustrated in other figures. There is an outer plate 46 and posts 48 connected therewith and in turn connected to the wall 28 but within the confines of the seat 30. All of the rollers and the drum to be described are journalled for rotation, either driven or idling, between the plate 46 and the wall 28.

In FIGS. 3 and 4 the transport means 24 are illustrated, but without showing the journals and mountings and also without showing the drive, clutch and brake mechanisms which may be used therewith, all of the latter being contained within the cabinet 16 as explained. The substrate which is to be coated is designated 50 and is shown to be transparent. In the preferred use of the apparatus, the substrate 50 forms the base for an electrophotographic film which has inorganic coatings sputtered thereon. In such instance the substrate 50 is synthetic resin sheeting such as polyester of about 0.005 to 0.010 inch thick. Several hundred meters of this material can be readily mounted on a spool or reel and contained within the apparatus 10 while being sputtered along its entire length. Such a spool or reel is shown at 52 and comprises the supply within the apparatus. It is mounted on a shaft 54 which is preferably driven by a suitable drive motor but controlled by a tension clutch that receives feedback information from speed measurement and control apparatus, all of which is contained in the cabinet 16.

The substrate strip 50 passes over an idler roller 56 which guides the reach to the drum 58 which comprises the anode of the sputtering apparatus 10. Looking for the moment at FIG. 8, it can be seen that the substrate 50 passes around the drum 58 which is also rotating, normally idling, in close proximity to the targets 60 and 62 which are located in the bottom of the chamber or vessel 20 as will be described and then passes upward to another idler roller 64 from which it is led around a take-up roller 66 that is driven by suitable drive motors from the interior of the cabinet 16. Since the diameters of the rolls of substrate on the supply reel 52 and the take-up roller 66 vary inversely to one another during sputtering and it is essential that the speed of movement of the substrate 50 relative to the targets be uniform and carefully controlled, suitable variable drive means to effect this must be provided. This is within the ambit of knowledge of those skilled in this art and need not be detailed.

Figure 6:
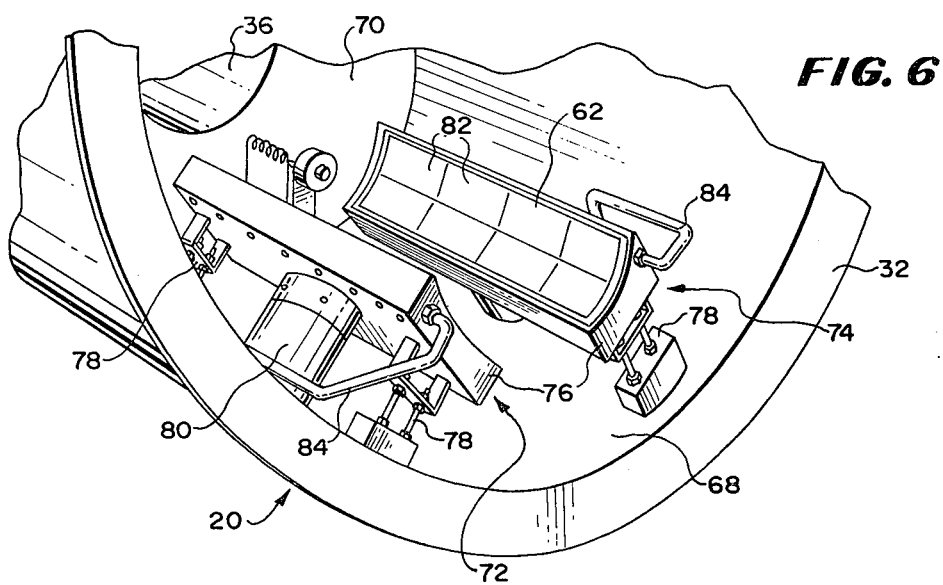
FIG. 6 is a fragmentary perspective view of generally the same portion of the chamber as illustrated in FIG. 5.
Figure 8:
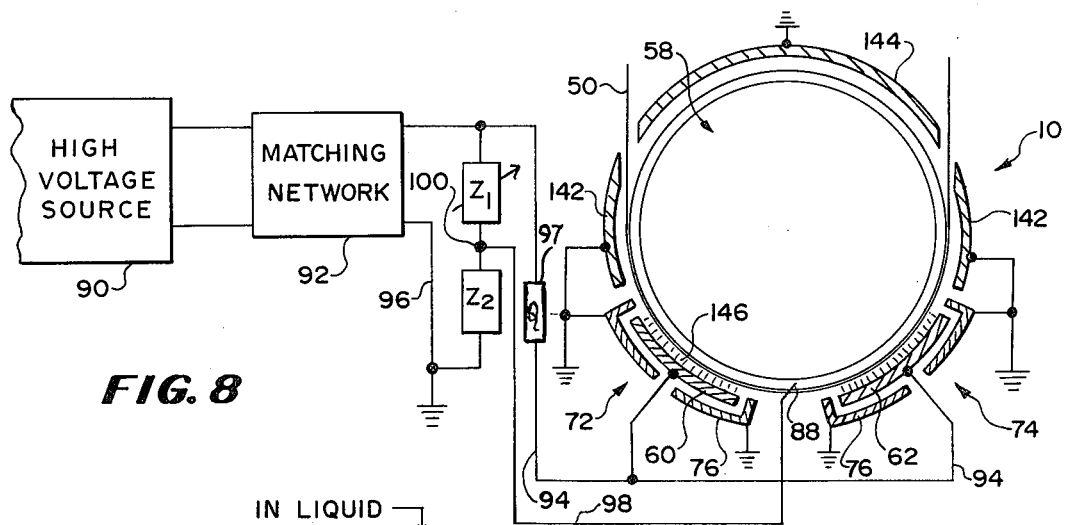
FIG. 8 is a block diagram illustrating the electrical circuitry of the sputtering apparatus of FIG. 1.

The targets 60 and 62 are shown in FIGS. 5, 6 and 8. The chamber or vessel 20 is in the form of a cylindrical shell 68 with an end bell 70 that couples with the conduit 36. All of the parts of the chamber or vessel 20 are formed of stainless steel and maintained at ground potential for safety. Fabrication of the vessel from this material is relatively simple compared to making it from glass or other insulating materials. The targets 60 and 62 are mounted in target assemblies 72 and 74 respectively that comprise shields 76 of metal that are mechanically mounted to the bottom of the shell 68 by the brackets 78 and cooled by coolant circulated through the walls of the shields 76. The conduits for the coolant are passed through the shell 68 by way of housings 80 that also provide for passage of electrical coupling elements for connecting the targets to the power supply. Means are provided for adjustment of the positions of the targets relative to the drum 58 as the targets are consumed. These may be contained in the housings 80 or be provided by adjustments on the brackets 78.

Each target 62 is formed of a plurality of plates or plaques such as best shown in FIG. 6 at 82 which are cemented on a suitable metal backing plate, usually stainless steel. The target plates 82 may have their surfaces facing the drum 58 flat planar or arcuately planar. They are arranged generally to define a cylindrical surface that is coaxial with the drum 58 when the drum is in position adjacent the targets and the apparatus 10 is closed. Each target 60 and 62 is spaced from its shield 76 leaving a space framing itself. Background gas is introduced into the hollow behind each target by way of the pipes 84 that pass through the wall of the shell 68 and emerges from the spaces around the targets to bathe the surfaces of the targets.

In the preferred embodiment, the target plaques are formed as sintered members of the material which is to be sputtered.

Between the target assemblies there is a standard 86 which mounts one or an assembly of brushes or wipers at 88. These will be called contact means and they connected to a part of the power supply electrical circuit by electrical lines passing through the wall 68 as will be explained. Preferably these contact means are mounted with resilient supports spring pressing them to the right as viewed in FIGS. 2 and 7. They must be insulated from the shell 68 as are the targets 60 and 62.

The details of construction of the drum 58 are being passed over for the present in order to explain the operation of the circuit of the power supply that is used in the apparatus 10 because the construction of the drum 58 is better appreciated when one understands the power circuit. For this purpose, attention is invited to FIG. 8.

In FIG. 8, the power or energy supply for the apparatus 10 is shown in most basic diagrammatic form. There is a high voltage power source shown at the left as block 90. The source 90 is coupled to the apparatus 10 by means of a matching network 92 that is shown having two lines at 94 and 96 for its output. The highest voltage, say of the order of 3000 volts at a frequency of 13.56 megahertz appears at the line 94 and is applied to the targets 60 and 62, appearing as a voltage to ground. The line 96 is at ground potential. All of the shielding in the apparatus 10 (represented here only by the drum 58, shileds 76 and the drum shields) is at ground potential, but the drum itself is not. Thus, the output from the matching network 92 is applied to a voltage divider which comprises in this simple example two impedances Z1 and Z2 connected across the lines 94 and 96. In practice, the impedance Z1 is a variable capacitor, the impedance Z2 comprises principally the capacitance of the drum 58 to ground and the parasitic capacitance paths in parallel therewith which have a minor effect. The lines may be high frequency plumbing, coaxial cable, shielded leads, etc. A resonant circuit 97 designated "Q" is inserted in lead 94 to provide high voltage to targets 60 and 62.

The voltage is divided in accordance with the respective reactance of the two impedances Z1 and Z2. The drum 58 is connected by way of a line 98 to the terminal 100 between the impedance Z1 and Z2. In order to enable the drum 58 to rotate, the contact means 88 previously described are provided to enable the drum to remain at a voltage which is not at ground potential. The electronic effect in sputtering in apparatus 10 is that of a diode, such that there is an effective rectifying action. The cathodes are the targets 60 and 62 and these are maintained at a very high negative voltage, which for the example given is −3000 volts. This is below ground potential, which assumes the maximum positive voltage for the system, being zero volts. The anode in a conventional sputtering machine is at ground potential and the substrate is laid upon it. In the invention herein, only the shielding is at ground potential. The anode is the drum 58 and it is maintained at a voltage which is also below ground, but not to the same extent as the targets 60 and 62. In the practical example, the voltage of the drum was maintained at some value about 50 volts or less below ground, that is −50 volts. This was achieved by proper design of the voltage divider string Z1 and Z2 and other parts of the circuit. Those skilled in designing power supplies for r.f. energized sputtering apparatus will understand this type of circuit and the nature thereof.

The drum 58 is required to be rotary, it is required to be made out of metal so that it can be easily fabricated and will have the necessary strength to stand up to the requirements of the sputtering apparatus, it is required to be journalled using mechanically durable bearings, shafts and supports, and yet at least its outer skin is required to be at a voltage that differs from its surroundings. Another requirement for the drum is that its outer skin must be subjected to temperature control by means of heat exchange liquids. Thus, in the practical example of the invention, it was deemed necessary to heat the outer skin of the drum by means of oil to maintain the same at a temperature of about 150° C.

Figure 7:
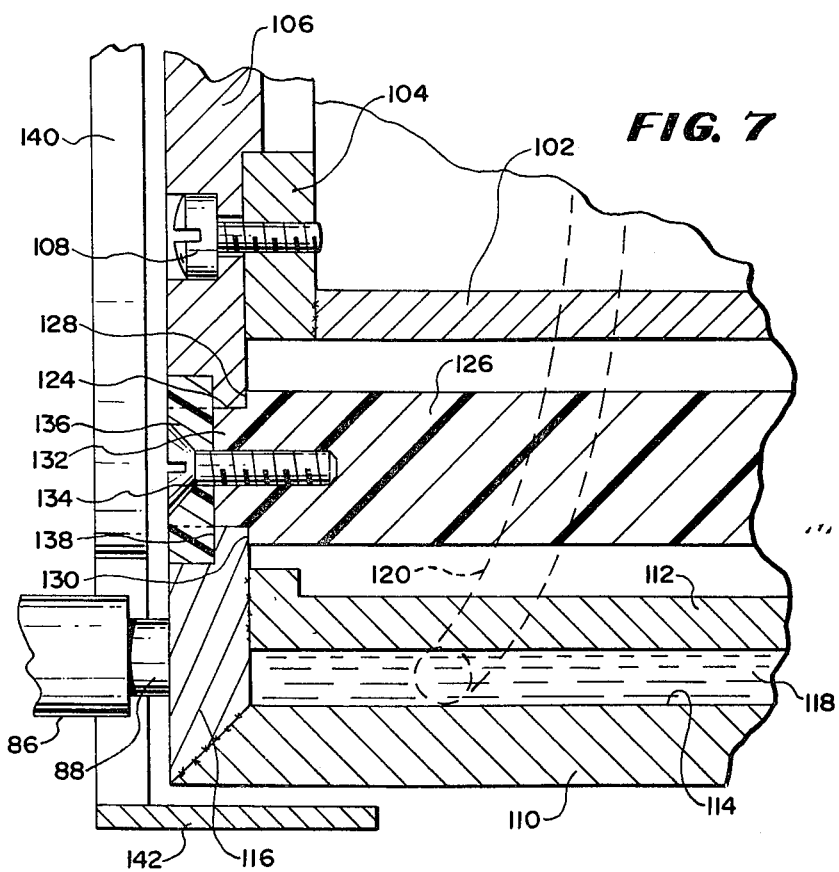
FIG. 7 is a detailed sectional view taken through the lower part of the drum anode of the apparatus of FIG. 1 to illustrate the manner in which contact is made with the same.

All of these requirements have been achieved by the invention through the use of a novel construction for the drum as shown in FIG. 7. The body of the drum 58 is formed of an inner metal cylinder 102 with end flanges or rings 104 welded thereto. The metal end caps or discs 106 are secured to the cylinder 102 by the circumferentially spaced screws 108. An outer coaxial metal cylinder 110 forms the circumferential skin of the drum 58 and it is welded to a telescopically arranged coaxial metal cylinder 112 of smaller diameter to form a chamber 114 between them. The cylinders 110 and 112 are connected by metal end rings 116 welded in place at each and the left hand metal end is exposed as shown.

The chamber 114 carries the heat exchange liquid 118 either in a bulk form which fills the entire chamber or by way of coils wrapped around the interior of the chamber (not shown). These are connected by way of suitable conduits such as shown at 120 to the hollow shaft 122 by way of which they are connected to a source of such liquid. Conduits are shown at 120'. Since the liquid will normally be oil or other insulating fluid there is no problem with providing an insulating coupling or couplings for the conduits 120 or 120' so that the skin 110 is electrically insulated from the remainder of the drum 58, the shaft 122, etc.

The rings 116 and the discs 106 are radially spaced apart to provide an annular space at each end of the drum 58 as shown at 124. A cylinder 126 of poly tetrafluorethylene or other stable insulating material is formed as for example by machining and is positioned between the cylinder 102 and the cylinder 112. It has its ends machined to a lesser thickness than its body so that the shoulders 128 and 130 are formed. The resulting axial ends 132 are made to have a thickness the same as the annular space 124 and the axial length of the cylinder 126 is made to be identical to the overall length of the drum 58 so that it is flush with the outer ends of the discs 106 and the rings 116. There is thus provided a composite cylindrical member in which the outer skin 110 is insulated from the remainder of the drum 58. The drum is held in assembly by means of a plurality of screws 134 that engage through washers 136 of the same insulating material and are spaced circumferentially around the ends of the drum. The washers 136 are set into deep recesses 138 that are bored into the ends of the drum 58, each recess 138 having a portion thereof in each of a disc 106, a ring 116 and an axial end 132. In this way, in addition to the washers 136 and screws 134 clamping the parts together axially, the parts are locked against relative movement circumferentially. Discs 106 have openings 135.

The ring 116 on the left hand end of the drum 58 is located in such a manner that when the apparatus 10 is in closed condition, the contact means will engage and wipe the same thereby establishing electrical contact therewith.

The ends of the drum 58 are shielded as shown at 140, 142, 144 to prevent material from being sputtered onto any other parts of the drum while the substrate 50 is passing around the bottom of the skin 110 and being coated thereat. The plasma representing the sputtering is indicated at 146. Such shielding is supported from the wall 28 and subframe 46 as for example by connecting brackets indicated at 147 in FIGS. 2, 3 and 4. It should be clear from FIG. 7 that the shielding members 140, 142 and 144 close off the ends of the drum 58 except to allow passage of the substrate strip 50 and to provide an opening to admit contact means 88 to wipe the ring 116. Also, these shielding members are at ground potential and nowhere touch the drum skin 110.

Figure 9:
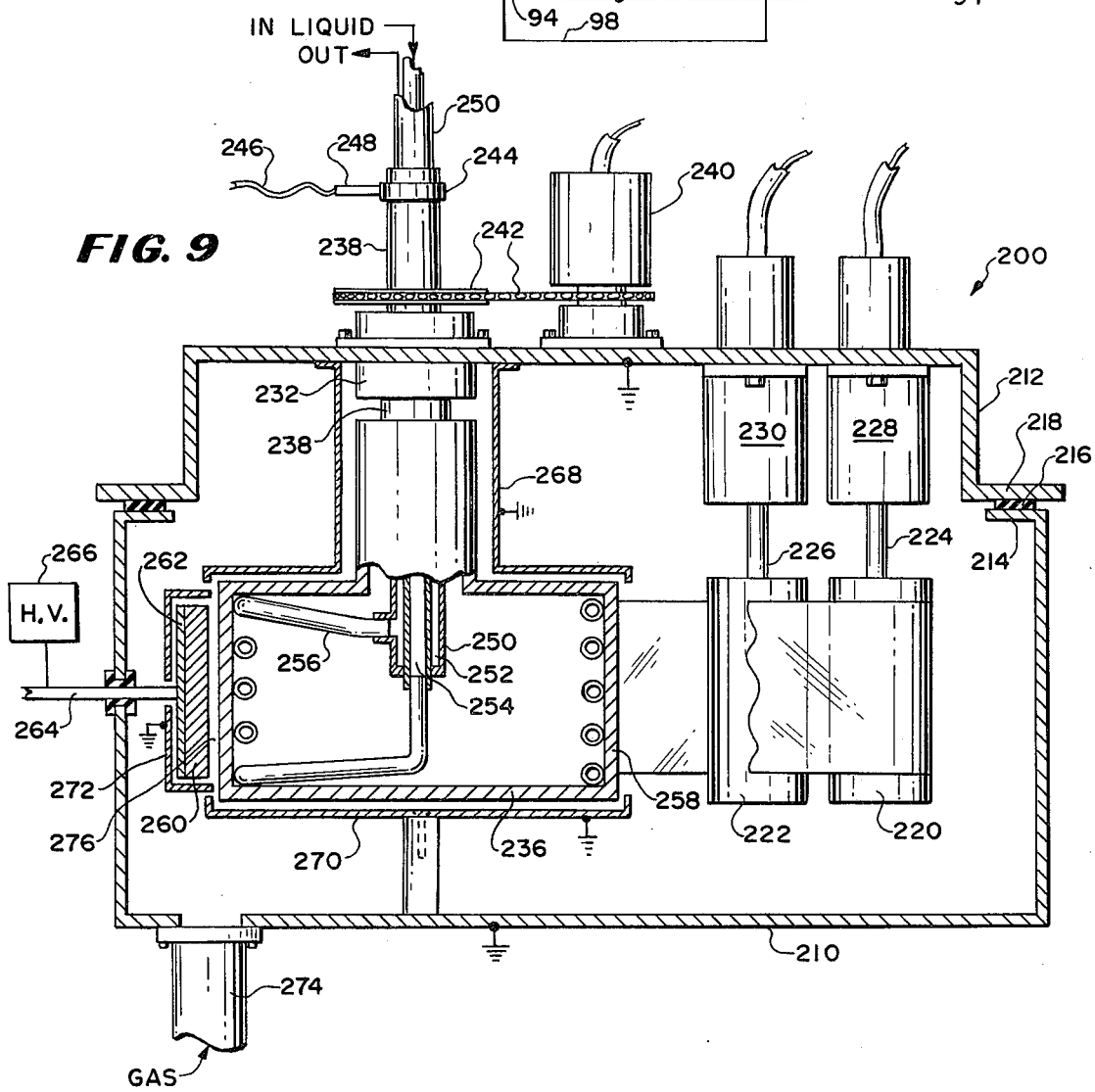
FIG. 9 is a sectional view, more or less diagrammatic, of a modified form of the invention.

Turning now to FIG. 9, illustrated therein is the modified form of the invention which, as mentioned, is especially useful for small projects. The apparatus 200 is a sputtering apparatus comprising a chamber 210 which has a cover member 212 adapted to be engaged onto the flange 214 of the chamber 210 and locked in place. Sealing is provided by the gasket 216 engaged between the flange 214 and the flange 218.

The cover member carries a supply reel 220 and a take-up reel 222 mounted on shafts 224 and 226 respectively. The shafts are driven by motors 228 and 230 respectively controlled from the exterior of the apparatus 200.

The cover 212 mounts a coupling 232 from which the drum 236 is suspended. In this case the drum is metal and the entire drum is insulated from the chamber 210 and the cover 212 by suitable insulation provided in the coupling 232. It is mounted on a shaft 238 which passes through the coupling 232 driven by the motor 240 mounted on the top of the cover 212. A sprocket chain and sprocket wheels such as 242 provides the coupling to the shaft 238 without short-circuiting the drum to ground. Suitable insulation is provided for this. A ring 244 on the shaft 238 connects to the drum 236 electrically and is isolated from all other parts of the apparatus 200. Electrical connection 246 with the contact means 248 correspond to the line 98 and the contact means 88 of FIG. 8.

The drum is hollow and has a central hollow conduit 250 providing coaxial chambers 252 and 254 which connect with the pipe 256 that passes around the skin 258 of the drum 236 on the interior thereof. Heat exchange liquid enters and circulates by way of the chambers 252 and 254. At the top of the view one can see where suitable couplings are attached to enable rotation of the shaft 250 through the use of rotary fluid couplings. These need not be shown.

The target 260 in this appartus 200 is a simple disc of the photoconductive material mounted on a holder 262 which is connected by way of the member 264 through the wall of the chamber 210 to a source of high voltage radio frequency 266. There is no need to show the circuitry of FIG. 8 since it is assumed to be used in connection with the apparatus 200.

Shielding at 268, 270 and 272 at ground potential is provided adjacent the drum 236, the drum mounting on the shaft 238 and the target 260. Sputtering plasma is produced in the same manner as in the case of the apparatus 10 through the use of suitable high frequency energy and a suitable background gas admitted as for example by the conduit 274 in the gap 276 between the skin 258 of the drum 236 and the face of the target 260.

The interior of drum 236 is sealed by reason of its construction but it may be evacuated with the chamber 210 if provided with openings in its ends as is the case with the drum 58.

The two embodiments which have been illustrated and described are only by way of example since the invention is capable of considerable variation without departing from the spirit or scope thereof as defined in the appended claims.

What is desired to secure by Letters Patent of the United States is:

1. A sputtering apparatus comprising:
   A. a vessel with an entrance and having cathode mounting means secured therein adapted to have sputtering target means mounted thereto,
   B. a closure for the vessel adapted to have its interior surface moved into sealing engagement with the entrance whereby to provide a sealed pressure chamber on the interior of the vessel when said closure is fully seated,
   C. a rotary anode mounted on the said interior surface and flexible strip substrate transport means also mounted on the said interior surface and adapted to move substrate over said rotary anode on the interior of the vessel for sputtering material of the target means onto said substrate when said sputtering apparatus is in operation,
   D. the closure and vessel walls being made of metal and adapted to be grounded,
   E. groundable shielding means surrounding at least said target means when mounted on said cathode mounting means whereby to leave a sputtering opening facing the anode,
   F. means for establishing and maintaining a sputtering plasma condition within the chamber between the target means and the anode and including a high voltage source coupled to the cathode mounting means, anode and ground in a circuit which maintains the cathode mounting means and the sputtering target means which may be mounted thereon at maximum negative voltage and the anode at a negative voltage which is a fraction of said maximum,
   G. said anode having a generally cylindrical formation including a metallic outer skin over which the substrate is adapted to travel as the anode rotates, at least the said outer skin being insulated from said closure and vessel walls and there being a coaxially arranged contact ring carried by said anode and electrically connected with said at least outer skin, and
   H. said apparatus including wiper contact means in sliding electrical contact with said ring at least when said closure is so engaged on said entrance and connected to said high voltage source to supply said fractional negative voltage to said anode.

2. The apparatus as claimed in claim 1 in which the wiper contact means are located inside of the vessel and the ring is located at an axial end of the anode, the dimensions and location of the wiper contact means relative to the ring being such that when the closure is fully seated; the ring and contact means are brought into electrical engagement.

3. The apparatus as claimed in claim 2 in which the anode is a cylindrical drum, the shielding means include means masking the axial ends of the skin and the ring, and openings are provided in the drum shielding means to permit the substrate to be laid upon and leave the skin and to permit passage of said contact means to said ring.

4. The apparatus as claimed in claim 1 in which the rotary anode comprises a drum, the interior body of which is adapted to be at ground potential and the outer skin of which is insulated from the said interior body.

5. The apparatus as claimed in claim 1 in which the rotary anode comprises a drum having an exterior cylindrical wall comprising said outer skin, there being a coaxial insulating spacer between the cylindrical wall and the interior of the drum, said interior being mounted on and grounded with said closure.

6. The apparatus as claimed in claim 1 in which the said contact means and ring are within the vessel when the closure is seated.

7. The apparatus as claimed in claim 1 in which the said contact means and ring are on the exterior of the vessel and are in electrical contact with one another also when the closure is not seated.

8. The apparatus as claimed in claim 1 in which the rotary anode comprises a metallic drum and there is an insulating coupling between said drum and the closure to permit rotation of the drum while remaining electrically insulated from said closure.

9. The apparatus as claimed in claim 1 in combination with target means mounted as aforesaid and in which the said target means comprise at least one planar member, a substantial portion of the area of which is exposed by said sputtering opening and spaced from said outer skin of the anode, the sputtering plasma condition being formed in the resulting gap.

10. The apparatus as claimed in claim 1 in combination with target means mounted as aforesaid and in which the said target means comprise at least one member having an arcuate planar surface, a substantial portion of the area of said surface being exposed by said sputtering opening and spaced from the outer skin of the anode, the sputtering plasma condition being formed in the resulting gap, the curvature of said surface being generally coaxial with the said outer skin.

11. The apparatus as claimed in claim 10 in which the arcuate planar surface is made up of a plurality of plaques of the material to be sputtered mounted on a metal backing.

12. The apparatus as claimed in claim 11 in which each of the plaques is planar.

13. The apparatus as claimed in claim 1 in combination with target means mounted as aforesaid in which the said target means comprise at least two independently mounted target members, each having an arcuate planar surface which has a curvature generally coaxial with the said outer skin, each member being spaced radially outward of the said outer skin when the closure is seated and providing a gap in which the sputtering condition occurs, said cathode mounting means comprising a separate holder mounting respective target members, the said holders with their target members being secured to the interior wall of said vessel and spaced circumferentially relative to said skin, said wiper contact means being mounted in said vessel between a pair of adjacent holders and target members and facing axially relative to the anode, said ring being on the anode end and adapted to engage said contact means when the closure is seated.

14. The apparatus as claimed in claim 1 in which the mounting for the rotary anode includes a hollow shaft that passes through the closure, the skin has means for passing heat exchange liquid in proximity thereto while rotating, and conduits are provided through the hollow shaft connected with said last means adapted to enable circulating of heat exchange liquid from a source exterior of the chamber through the conduits and into heat exchange relationship with said skin to affect the substrate during sputtering.

15. In a sputtering apparatus which includes a vessel having a closure, target means mounted on the interior of the vessel, a drum anode and transport means for leading a flexible substrate member over the anode mounted on the closure and adapted to be brought into sputtering relationship with the target means when the closure is seated, grounded target shielding and grounded anode shielding means, means for establishing a sputtering plasma condition between the target means and the anode when the closure is seated thereby closing the vessel and including a source of high frequency electrical energy and circuit means coupling said energy to said target means, anode and grounded shielding means, the invention herein comprising means for maintaining the drum anode at a voltage which differs from that of said grounded shielding means and that of said target means, respectively.

16. The invention as claimed in claim 15 in which the closure and vessel are metallic and maintained at the same potential as the shielding means, the drum anode has a body which is insulated from its outer skin, said body being metallically connected to said closure, there being contact means mounted in the closure insulated therefrom and connected into said circuit and electrically engaging said outer skin when said closure is seated.

17. The invention as claimed in claim 16 in which the contact means includes a spring-pressed member adapted for movement parallel to the axis of said drum anode, said outer skin having an axially facing ring and the ring being brought into engagement with said spring-pressed member when the closure is seated.

18. The invention as claimed in claim 16 in which the drum anode is formed of at least three telescopically assembled cylinders, including an inner metallic cylinder providing the support for the drum anode and mounted on the closure, an outer metallic cylinder comprising said outer skin and an intervening cylinder of insulating material, all three cylinders being clamped together to form an integral assembly.

19. The invention as claimed in claim 18 in which the outer cylinder has a chamber formed therein for carrying heat-exchange liquid and means are provided for conveying said heat-exchange liquid from the said chamber to exterior of said apparatus through said closure.

* * * * *

UNITED STATES PATENT AND TRADEMARK OFFICE
CERTIFICATE OF CORRECTION

PATENT NO. : 4,014,779
DATED : March 29, 1977
INVENTOR(S) : MANFRED R. KUEHNLE

It is certified that error appears in the above-identified patent and that said Letters Patent are hereby corrected as shown below:

Col. 6, line 65, change "connected" to --connect--;
Col. 6, line 66, change "wall" to --shell--;
Col. 7, line 21, change "shileds" to --shields--
Col. 10, line 57, change semicolon to a comma Signed and Sealed this Twenty-first Day of June 1977

[SEAL]

Attest:

RUTH C. MASON
*Attesting Officer*

C. MARSHALL DANN
*Commissioner of Patents and Trademarks*